(12) United States Patent
El-Sayed

(10) Patent No.: US 8,890,637 B2
(45) Date of Patent: Nov. 18, 2014

(54) AUTOMATIC TERMINATION CIRCUIT AND METHOD

(75) Inventor: Hassan El-Sayed, Manchester (GB)

(73) Assignee: Sira Consulting Limited (GB)

( * ) Notice: Subject to any disclaimer, the term of this patent is extended or adjusted under 35 U.S.C. 154(b) by 586 days.

(21) Appl. No.: 13/288,402

(22) Filed: Nov. 3, 2011

(65) Prior Publication Data

US 2012/0112848 A1    May 10, 2012

(30) Foreign Application Priority Data

Nov. 5, 2010 (GB) .................................. 1018725.0

(51) Int. Cl.
*H03H 11/28* (2006.01)
*H04L 25/02* (2006.01)

(52) U.S. Cl.
CPC ........... *H04L 25/0298* (2013.01); *H03H 11/28* (2013.01)
USPC ......................................... 333/22 R; 326/30

(58) Field of Classification Search
USPC ............................................. 333/22 R, 17.2
See application file for complete search history.

(56) References Cited

U.S. PATENT DOCUMENTS

| 4,748,426 A | * | 5/1988 | Stewart ....................... 333/22 R |
| 5,920,266 A | | 7/1999 | Allgood et al. |
| 6,781,474 B2 | * | 8/2004 | Douziech et al. ............ 333/17.1 |

FOREIGN PATENT DOCUMENTS

DE    10 2005 040 932 A1    3/2007
WO    WO 02/088986 A1    11/2002

OTHER PUBLICATIONS

UK Search Report under Section 17 for GB1018725.0; Date of Search Mar. 2, 2011; 1 page.

* cited by examiner

*Primary Examiner* — Stephen Jones
(74) *Attorney, Agent, or Firm* — Myers Bigel Sibley & Sajovec

(57) ABSTRACT

An electronic circuit arranged to terminate automatically a plurality of conductors at or near a node of a network comprising: a first input terminal electrically coupled to a first output terminal; a second input terminal electrically coupled to a second output terminal; selectable current limiting means (SCLM) arranged to limit an amount of current that may flow between the second output terminal and the second input terminal; and detecting means arranged to control switching means operable to switch the circuit between a first and a second condition responsive to the electrical potential Vx of the second output terminal, wherein in the first condition the circuit is a terminating circuit and the SCLM is selected to have a first current limit, and in the second condition the circuit is a continuing circuit and the SCLM is selected to have a second current limit.

24 Claims, 4 Drawing Sheets

AUTOMATIC TERMINATION CIRCUIT AND METHOD

RELATED APPLICATION

The present application claims priority under 35 U.S.C. §119 to Great Britain Patent Application No. 1018725.0, filed Nov. 5, 2010 in the Great Britain Intellectual Property Office, the disclosure of which is incorporated herein by reference in its entirety.

FIELD OF THE INVENTION

The present invention relates to electronic circuits for terminating a transmission line of a communications network. In particular but not exclusively the present invention relates to electronic circuits suitable for terminating automatically a communications network.

BACKGROUND

It is known to provide a communications network in which a group of electronic devices communicate with one another via a communications bus in the form of a plurality of electrical conductors of a cable. Each device may be referred to as a node of the network.

It is to be understood that maintenance of the integrity of the transmitted signal and minimising signal reflection and distortion due to high frequency wideband switching and wireless communications interference are important considerations in the engineering of transmission bus networks. It is therefore important to terminate a network with a terminating circuit having an appropriate matching impedance. If a circuit is incorrectly terminated, malfunction of the network can result, due for example to reflection at a node of signals propagating through the network and introduction of noise.

Networks are normally terminated at both ends, i.e. at a host device at one end of a communications cable and at a node at the opposite end of the cable.

GB2407237 discloses an electronic circuit for automatic termination of a plurality of conductors of a communications network. Such a circuit may be referred to as an auto-termination circuit.

The circuit has detecting means operable to detect current in at least one of the plurality of conductors and switching means operable to switch the circuit between being a continuing circuit, upon the detecting means detecting a current greater than a first predetermined threshold, and being a terminating circuit, upon the detecting means detecting current at, or less than, a second predetermined threshold wherein the detecting means comprises a sensing resistor connected in series with the at least one of a plurality of conductors, and means for detecting voltage across the sensing resistor. The document discloses using detecting means in the form of a differential amplifier connected across the sensing resistor.

A known problem with this method based on a sensing resistor is that the circuit is highly susceptible to noise irrespective of any online filtering. Such noise may be generated from mobile communication devices such as handheld radio communications devices operating within the frequency range 150-750 MHz. Such devices are frequently used in industry such as in the petrochemical industry.

Noise signals generated on a signal line of the network can cause the detecting means to trigger intermittently the terminator circuit causing the terminator circuit automatically to terminate the network at locations where termination is not required. This can result in instability of the network rendering the network unreliable in certain situations. It is to be understood that failure of an industrial communications network can lead to shutdown of manufacturing or other plant relying on the network. This can be costly to an operator of the plant.

A further known problem with this sensing resistor-based method is that the auto-termination circuit is triggered in response to current flow through the sensing resistor. Current flow may be due to a true load or to a circuit fault such as a cable fault or electronic module fault. It is to be understood that this method is unable to detect the presence of a short circuit fault in the network. Short circuit faults can result in failure of an entire network and even damage to devices coupled to the network.

STATEMENT OF THE INVENTION

In a first aspect of the invention there is provided an electronic circuit arranged to terminate automatically a plurality of conductors at or near a node of a network comprising:
  a first input terminal electrically coupled to a first output terminal;
  a second input terminal electrically coupled to a second output terminal;
  selectable current limiting means (SCLM) arranged to limit an amount of current that may flow between the first output terminal and the first input terminal; and
  detecting means arranged to control switching means operable to switch the circuit between a first and a second condition responsive to the electrical potential Vx of the second output terminal,
  wherein in the first condition the circuit is a terminating circuit and the SCLM is selected to have a first current limit, and
  in the second condition the circuit is a continuing circuit and the SCLM is selected to have a second current limit.

By "current limit" is meant an upper limit to the amount of current the SCLM will allow to flow therethrough.

Preferably the circuit is arranged to assume the first condition when an open circuit condition exists between the first and second output terminals.

More preferably the circuit is arranged to assume the first condition when a short circuit condition exists between the first and second output terminals.

The circuit may be arranged to assume the second condition when a load between the first and second output terminals has an impedance $Z_L$ between first and second impedance values $Z_1$ and $Z_2$ respectively, where $0<Z_1<Z_L<Z_2$ and $Z_2$ is finite.

Preferably the first impedance value $Z_1$ is greater than around 1 kilohm and the second impedance value $Z_2$ is less than around 50 kilohms.

Preferably the second current limit is greater than the first current limit.

Alternatively the first current limit may be substantially the same as the second current limit.

In a further alternative the second current limit may be less than the first current limit.

Preferably the second current limit corresponds to a maximum current allowed to be drawn by the circuit when the circuit is a continuing circuit.

Preferably the first current limit corresponds to a maximum current allowed to be drawn by the circuit when the circuit is a terminating circuit and a short circuit condition exists between the first and second output terminals.

Preferably the detecting means comprises comparator means arranged to compare the value of the electrical potential Vx at the second output terminal with one or more reference potentials and to provide an output responsive to a difference between Vx and the one or more reference potentials thereby to control the circuit to switch between the first and second conditions.

More preferably the detecting means comprises first and second comparators, the first comparator being arranged to compare the value of electrical potential Vx at the second output terminal with a first reference potential Vref1 and to produce an output responsive to the value of Vx and Vref1, the second comparator being arranged to compare the value of electrical potential Vx at the second output terminal with a second reference potential Vref2 and to produce an output responsive to the value of Vx and Vref2, the detecting means being operable to control the circuit by means of switching means to switch between the first and second conditions in dependence on the output of the first and second comparators.

Preferably Vref1 is greater than Vref2.

The outputs of the first and second comparators are preferably combined by means of a logical AND operation thereby to provide an output of the detecting means.

Preferably the output of the detecting means is coupled to the switching means by means of a switching means control portion, the switching means control portion comprising a shunt portion coupled between the first and second input terminals.

Preferably the shunt portion comprises a resistor in series with one or more switches, the switches being arranged to assume a closed condition thereby to couple the resistor between the first and second input terminals when the circuit is in the second condition.

This feature has the advantage that a risk that voltage spikes across the first and second input terminals induces unwanted disconnection of the terminating portion between the input terminals is reduced.

Preferably the SCLM comprises a controlled constant current source.

Preferably, in the first condition a terminating portion of the circuit is coupled between the first and second input terminals and in the second condition the terminating portion is not coupled between the first and second input terminals.

Preferably the terminating portion comprises impedance matching means.

The impedance matching means may comprise a terminating resistor connected in series with a terminating capacitor.

The switching means may comprise one or a plurality of switching elements in series with the terminating portion.

Preferably the switching means comprises a plurality of switching elements in series with the terminating portion.

This feature has the advantage that if one of the switching elements fails in a closed condition the circuit will continue operating, increasing a reliability of the circuit.

Preferably one of the switching elements is provided between the terminating portion and the first input terminal and another of the switching elements is provided between the terminating portion and the second input terminal.

The switching elements are preferably provided by one or more transistor devices.

In a second aspect of the invention there is provided a node of a communications network comprising an electronic circuit according to the first aspect.

In a third aspect of the invention there is provided a communications network comprising a circuit according to the first aspect.

In a fourth aspect of the invention there is provided a method of terminating automatically a circuit at or near a node of a network comprising the steps of:

detecting an electrical potential at an output of the circuit; and switching the circuit between a first and a second condition responsive to the electrical potential Vx of the output, whereby in the first condition the circuit is arranged to be a terminating circuit and a maximum current that may flow between the output and an input of the circuit is selected to have a first current limit, and in the second condition the circuit is arranged to be a continuing circuit and the maximum current that may flow between the output and the input of the circuit is selected to have a second current limit.

In one aspect of the invention there is provided an electronic circuit arranged to terminate automatically a plurality of conductors at or near a node of a network comprising:

input means electrically coupled to output means;

selectable current limiting means (SCLM) arranged to limit an amount of current that may flow between the output means and the input means; and detecting means arranged to control switching means operable to switch the circuit between a first and a second condition responsive to the electrical potential Vx of the second output terminal, wherein in the first condition the circuit is a terminating circuit and the SCLM is selected to have a first current limit, and in the second condition the circuit is a continuing circuit and the SCLM is selected to have a second current limit.

In a further aspect of the invention there is provided an electronic circuit arranged to terminate automatically a plurality of conductors at or near a node of a network comprising:

a first input terminal electrically coupled to a first output terminal;

a second input terminal electrically coupled to a second output terminal;

selectable current limiting means (SCLM) arranged to limit an amount of current that may flow through the circuit between the first input terminal and the second input terminal; and detecting means arranged to control switching means operable to switch the circuit between a first and a second condition responsive to the electrical potential Vx of an output terminal, wherein in the first condition the circuit is a terminating circuit and the SCLM is selected to have a first current limit, and in the second condition the circuit is a continuing circuit and the SCLM is selected to have a second current limit.

The communication network may be for example an industrial network employing a fieldbus protocol such as the International Electrotechnical Commission (IEC) standard 61158 for industrial communication networks.

Some embodiments of the invention have the advantage that they provide a stable electronic auto-termination circuit capable of maintaining the integrity of the communication signal of a network such as but not exclusively between the "T" nodes of a fieldbus network under cable faults such as open circuit and short circuit in the presence of electrical noise.

BRIEF DESCRIPTION OF THE DRAWINGS

Embodiments of the invention will now be described with reference to the accompanying figures in which.

DETAILED DESCRIPTION

Figure 1:
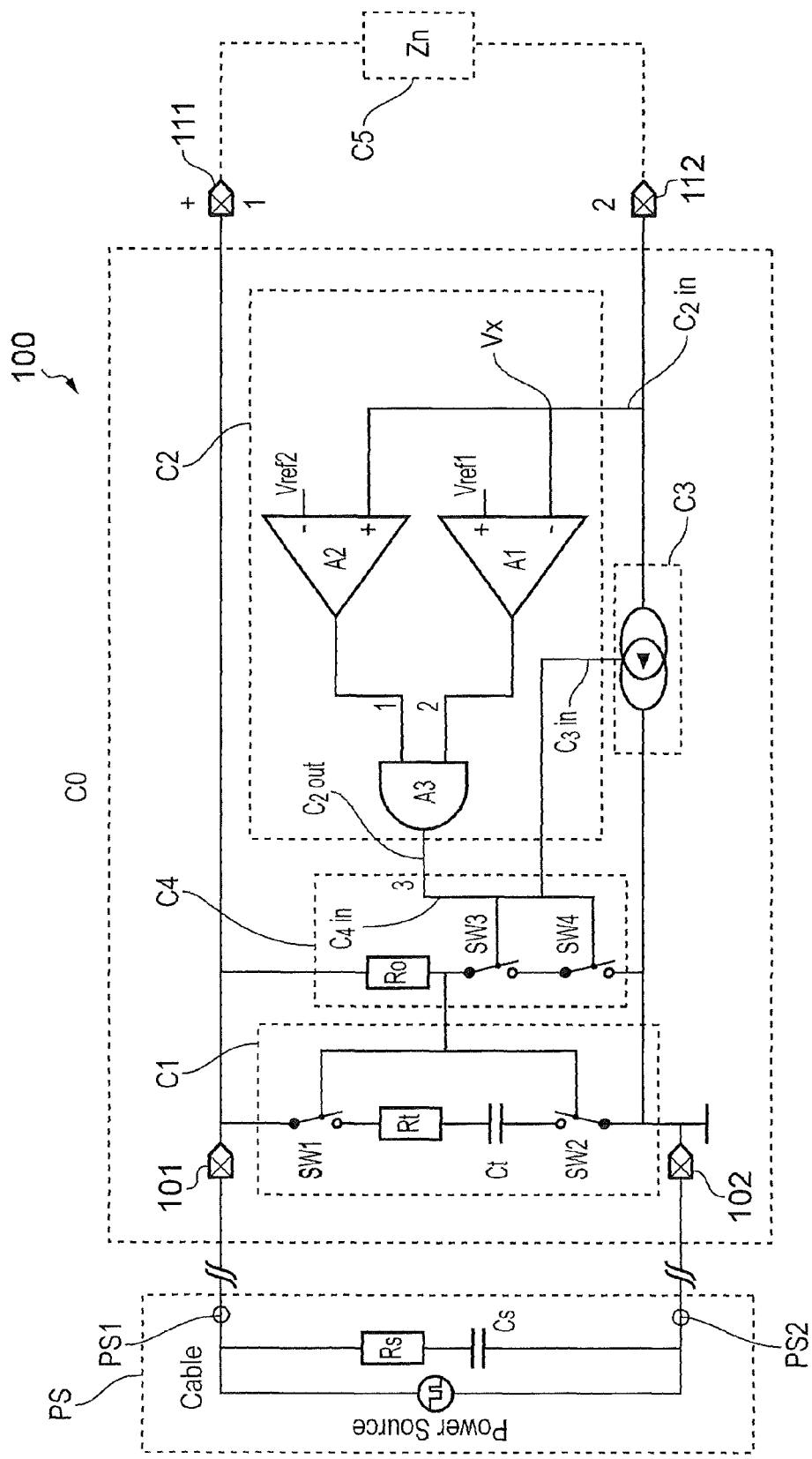
FIG. 1 is a schematic diagram of an electronic circuit according to an embodiment of the present invention.

FIG. 1 shows an auto-terminating circuit 100 according to an embodiment of the present invention.

The circuit 100 has first and second input terminals 101, 102 coupled to corresponding first and second output terminals 111, 112 of the circuit 100.

In use the input terminals 101, 102 are typically coupled to first and second terminals PS1, PS2 of a power source or power supply PS. It is to be understood that the first and second input terminals 101, 102 may be coupled to the power source PS via one or more other circuits 100. Other arrangements are also useful.

The first and second terminals PS1, PS2 of the power source PS are arranged to provide a DC power signal to the circuit 100. It is to be understood that communications data may be superimposed on the DC power signal by devices at nodes of the network as discussed in more detail below.

It is to be understood that the network devices may each be provided with an auto-terminating circuit 100 according to the present invention.

The circuit 100 has four portions: a terminating portion C1, an output monitoring portion C2, an output control portion C3 and a termination control portion C4.

The terminating portion C1 comprises a terminating resistor Rt in series with a terminating capacitor Ct. A first switch SW1 is provided between the terminating resistor Rt and the first input terminal 101. A second switch SW2 is provided between the terminating capacitor Ct and the second input terminal 102. Thus it is to be understood that the terminating portion C1 may be isolated from the first and second input terminals 101, 102 by opening either one or both of the switches SW1, SW2. The circuit 100 may be said to be in a continuing condition in this state since the terminating portion C1 is not connected between the first and second input terminals 101, 102.

The terminating portion C1 may be coupled between the first and second input terminals 101, 102 thereby to terminate the circuit 100 by closing both switches SW1, SW2. The circuit may be said to be in a terminating condition in this state.

In the embodiment shown the circuit 100 is arranged to control both the first and second switches SW1, SW2 together by means of a termination control portion C4 such that either both of the switches SW1, SW2 are closed or both of the switches SW1, SW2 are open as discussed below, although other arrangements are also useful.

An input terminal C4in of the termination control portion C4 is coupled to an output C2out of the output monitoring portion C2. If the logical state of the output C2out is low the termination control portion C4 is arranged to control the terminating portion C1 to close the first and second switches SW1, SW2 so that the circuit 100 assumes the terminating condition.

Conversely, if the logical state of the output C2out is high the termination control portion C4 is arranged to control the terminating portion C1 to open the first and second switches SW1, SW2 so that the circuit 100 assumes the continuing condition.

In the embodiment of FIG. 1 the switches SW1, SW2 are each provided by a transistor device although other forms of solid state switching device could be used.

The output control portion C3 is provided between the second input terminal 102 and the second output terminal 112. The output control portion C3 is arranged to limit a maximum current that may flow through the output control portion C3 from the second output terminal 112 to the second input terminal 102 to either a first value or a second value, the first value being less than the second value, in dependence on a state of an input terminal C3in of the output control portion C3. The input terminal C3in is coupled to the output terminal C2out of the output monitoring portion C2, together with the input terminal C4in of the termination control portion C4.

If the state of the input terminal C3in is set to logical zero, the output control portion C3 is arranged to set the maximum current that may flow therethrough to the first (lower) value, the circuit being in the terminating condition.

If the state of the input terminal C3in is set to logical one, the output control portion C3 is arranged to set the maximum current that may flow therethrough to the second (higher) value, the circuit being in the continuing condition.

The output monitoring portion C2 has an input terminal C2in coupled to the second output terminal 112 whereby the output monitoring portion C2 may sense a potential Vx of the second output terminal 112.

The output monitoring portion C2 has first and second comparators A1, A2 respectively. A negative input of the first comparator and a positive input of the second comparator are both coupled to the second output terminal 112.

The positive input of the first comparator A1 is held at a first reference potential Vref1 and the negative input of the second comparator A2 is held at a second reference potential Vref2 where Vref2 is less than Vref1. The values of Vref1 and Vref2 are discussed in further detail below.

Respective outputs of the first and second comparators A1, A2 are coupled to respective inputs of an AND gate A3 the output of which provides the output C2out of the output monitoring portion C2.

It is to be understood that the output monitoring portion C2 is configured to set the logical state of its output terminal C2out according to the value of Vx as follows.

If Vx has a value that is above Vref1 or below Vref2 the output monitoring portion C2 is arranged to set the state of the output terminal C2out to logical zero. This causes the output control portion C3 to set the maximum allowable current therethrough to the first (lower) value and the termination control portion C4 to control the terminating portion C1 to assume the terminating condition.

However if Vx has a value between Vref1 and Vref2 the output monitoring portion C2 is arranged to set the state of the output terminal C2out to logical one. This causes the output control portion C3 to set the maximum allowable current therethrough to the second (higher) value and the termination control portion C4 to disconnect the terminating portion C1 from the input lines 101, 102 whereby the circuit 100 assumes the continuing condition.

It is to be understood that the second value of maximum allowable current is selected to be a value sufficient to allow the maximum amount of current that may be required in use to flow through the circuit 100.

It is to be understood that the value of Vx is responsive to a value of impendance of a load connected between the output terminals 111, 112 and may be used to determine whether this load has an acceptable impedance. By acceptable impedance is meant an impedance that will allow the network of which the circuit 100 may be part to perform correctly.

If the output terminals 111, 112 are connected across a load having an acceptable impedance the value of Vx will have a value within a prescribed range. The values of Vref1 and Vref2 are selected such that Vref1 is greater than the maximum allowed value of Vx when an allowed load is connected and Vref2 is less than the minimum allowed value of Vx when an allowed load is connected.

Thus, if an allowed load is connected between the output terminals 111, 112 the output monitoring portion C2 controls the output control portion C3 to set the maximum current that may flow therethrough to the second value.

It is to be understood that if no load is connected between the first and second output terminals 111, 112 (i.e. open circuit conditions exist), the second output terminal 112 is arranged to have a potential substantially equal to that of the second input terminal 102. This is because substantially no current can flow into or out from the second output terminal 112 through C3 and therefore the potential across C3 will be substantially zero.

If Vref2 is set to a potential greater than the second input terminal 102 then the output terminal C2out of the output monitoring portion C2 will be set to logical zero when open circuit conditions exist between the output terminals 111, 112. This in turn causes the output control portion C3 to set the maximum current that may flow therethrough to the first value which is less than the second value and the termination control portion C4 to couple the terminating portion C1 between the first and second input terminals 101, 102.

If the output terminals 111, 112 are directly connected to one another by means of a short circuit (due for example to a fault in a circuit to which the terminals 111, 112 are connected), Vx will have substantially the same potential as the first output terminal 111 which is in turn substantially the same as that of the first input terminal 101.

Vref1 is therefore set to a value that is less than the potential at the first input terminal 101 such that, if the first output terminal 111 is directly connected to the second output terminal 112, Vx is greater than Vref1 and the output monitoring portion C2 controls the termination control portion C4 to couple the terminating portion C1 between the first and second input terminals 101, 102 by closing the first and second switches SW1, SW2. The output control portion C3 is set to limit the maximum current that may flow therethrough to the first value.

The termination control portion C4 has a control resistor Rc coupled to the first input terminal 101 and third and fourth switch elements SW3, SW4 of the circuit 100 coupled in series between the control resistor Rc and the second input terminal 102.

The third and fourth switches SW3, SW4 are both coupled to the input terminal C4in of the termination control portion C4 such that when the input terminal C4in is set to logical one both switches SW3, SW4 are closed and when the input terminal C4in is set to logical zero both switches SW3, SW4 are open. In the embodiment shown the third and fourth switches SW3, SW4 are both provided by transistor devices.

It is to be understood that when the third and fourth switches SW3, SW4 are closed Rc is connected between the first and second input terminals 101, 102. The potential applied to the first and second switches SW1, SW2 is therefore the same as that of the second input terminal (logical zero) and the first and second switches remain in the open condition such that the circuit 100 functions as a continuing circuit with the terminating portion C1 disconnected from the first and second input terminals 101, 102.

When the third and fourth switches SW3, SW4 are open, Rc is disconnected from the second input terminal 102. The potential applied to the first and second switches SW1, SW2 is therefore the same as that of the first input terminal (logical one) and the first and second switches assume the closed condition such that the circuit 100 functions as a terminating circuit with the terminating portion C1 connected between the first and second input terminals 101, 102

The arrangement described in respect of termination control portion C4 has the feature that when the circuit is in the continuing mode with the third and fourth switches closed, a shunt path exists for spikes in the potential applied between the first and second input lines, for example due to radio frequency (RF) interference. Voltage spikes can cause unwanted termination of known auto-terminating circuits by triggering connection of a terminating circuit between the input terminals 101, 102. In the circuit 100 of FIG. 1 the termination control portion C4 allows such voltage spikes to be shunted between the first and second input lines 101, 102 without triggering closure of the first and second switches. This increases a stability of the network in which the circuit 100 is connected.

Figure 2:
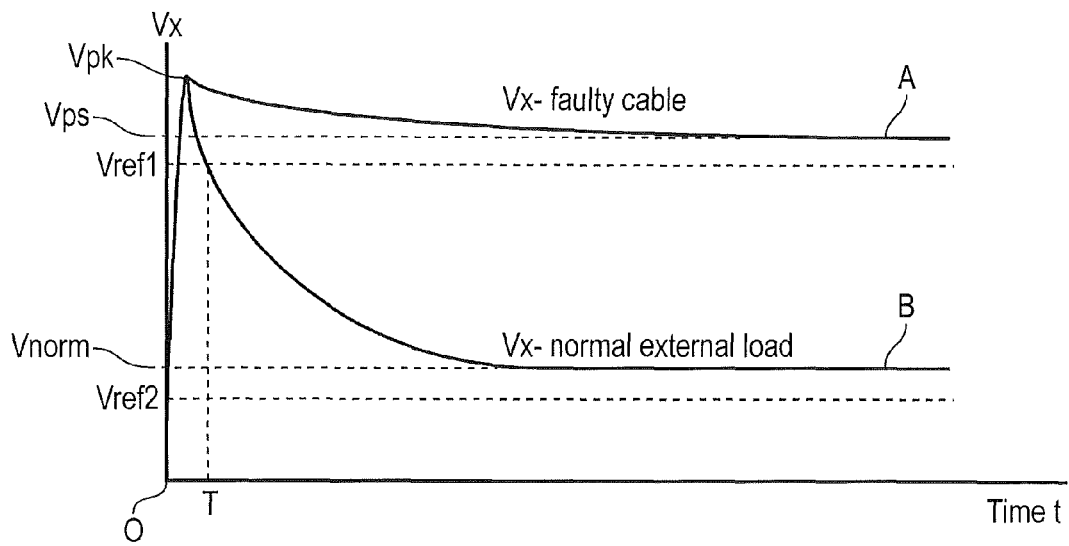
FIG. 2 is a plot of Vx as a function of time for the circuit of FIG. 1 following a cable fault in the form of a short circuit (trace A) between circuit output terminals or connection of a load between the output terminals having an acceptable impedance allowing correct network operation (trace B)

FIG. 2 shows a plot of Vx as a function of time for different connection states of the output terminals 111, 112.

Trace A shows Vx as a function of time following short circuiting of output terminals 111, 112 at time t=0. The potential at Vx rises sharply to a peak value Vpk upon connecting the output terminals 111, 112 together before decreasing to a steady state value Vps corresponding to the potential Vps of the power supply PS. It can be seen that Vref1 is set to a value that is less than Vps so that the circuit remains in a terminating condition throughout the period for which the output terminals 111, 112 are short circuited.

Trace B shows Vx as a function of time following connection of an external load having an impedance within an allowed range.

The potential Vx again rises sharply to a peak value Vpk upon connecting the external load before falling to an expected or normal value Vnorm for such a load. It can be seen that the value of Vx falls below Vref1 after a time T has elapsed following connection of the external load. Furthermore it can be seen that Vref2 is set to a value such that it remains below Vnorm throughout.

It is to be understood that the circuit 100 assumes a terminating condition for the period for which Vx exceeds Vref1. However as soon as Vx falls below Vref1 the circuit assumes the continuing condition.

Figure 3:
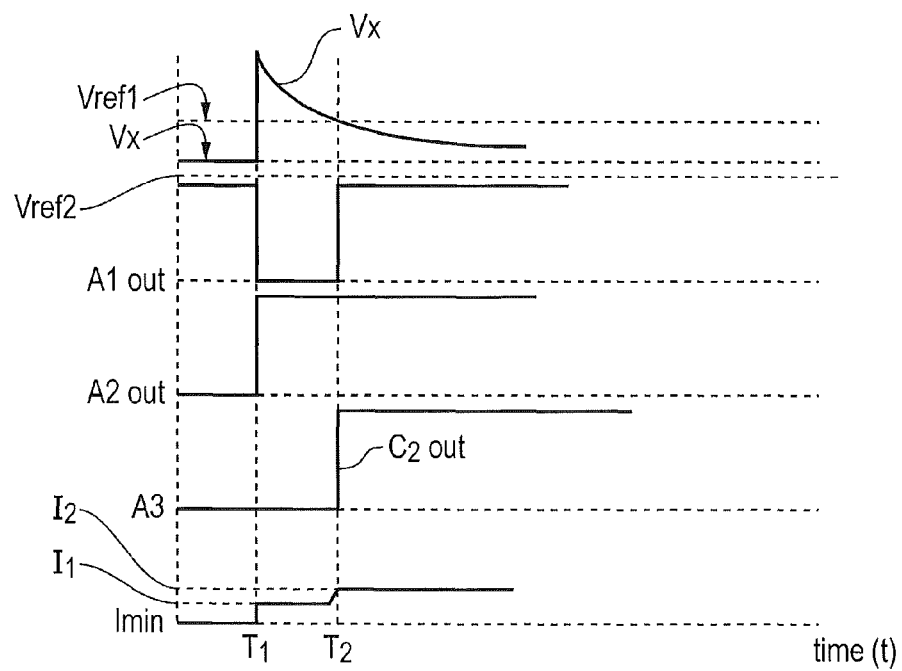
FIG. 3 is an electronic signal timing diagram showing the potential at each of several locations of the circuit as a function of time following connection of a normal external load.

FIG. 3 is a timing diagram showing the states of outputs A1out, A2out of the first and second comparators A1, A2 respectively, the state of output C2out of the output monitoring portion C2 and the value of maximum current allowable to pass through the output control portion C3 as a function of the value of Vx.

It can be seen that when Vx is greater than Vref1 (for the period from time t=T1 to t=T2) A1out is set to logical zero, A2 out is set to logical one, A3 is set to logical zero and the output control portion C3 is set to allow maximum current flow therethrough of a first value I1.

When Vx falls below Vref1 (after time t=T2) A1out transitions to logical 1, A2out remains at logical one and therefore A3out transitions to logical one. The value of maximum current permitted through the output control portion C3 rises to a second value I2 greater than the first value I1.

Figure 4:
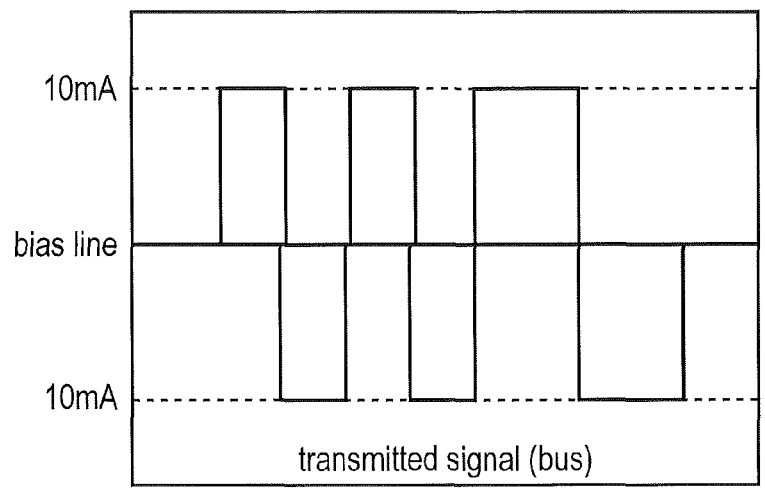
FIG. 4 shows a communications signal of a typical fieldbus network superimposed on a DC 'offset' signal.

FIG. 4 is a trace of the amplitude of a communications signal of a typical fieldbus network as a function of time. The communications signal is a binary digital signal superimposed on a DC 'offset' signal provided by the power supply PS.

It is to be understood that other arrangements are also useful

Figure 5:
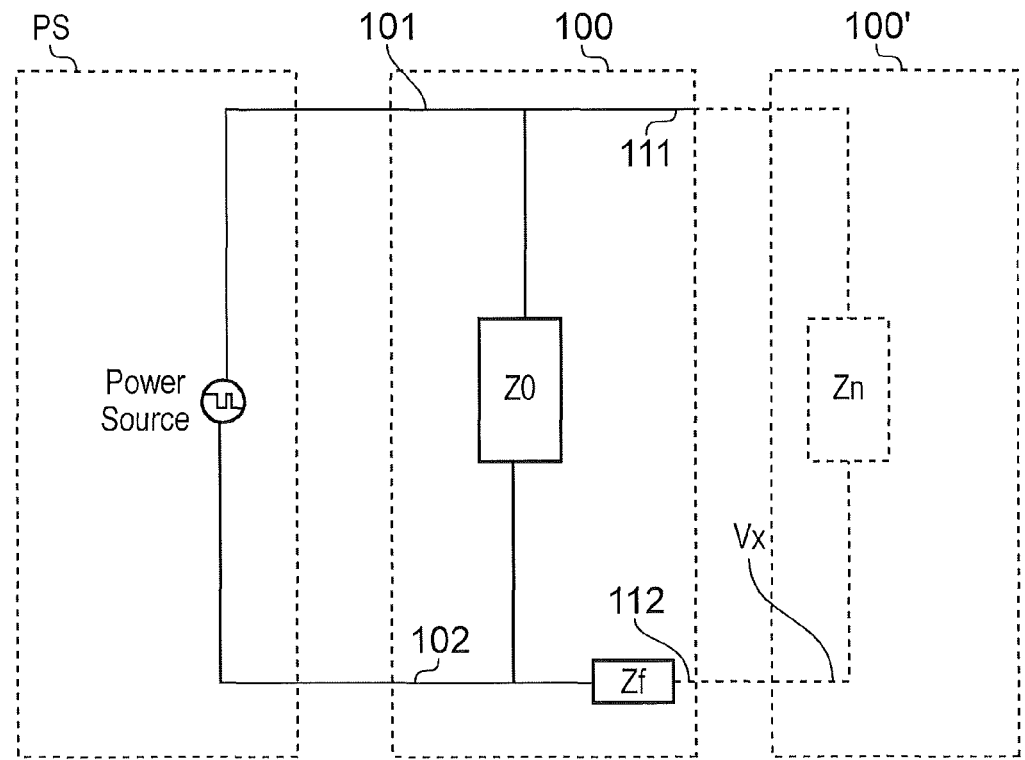
FIG. 5 shows two circuits according to embodiments of the invention connected in a network.

FIG. 5 is a schematic diagram illustrating the circuit 100 having input terminals 101, 102 coupled to a power supply PS and output terminals 111, 112 coupled to a further circuit 100' identical to the first circuit 100. The further circuit 100' presents an impedance Zn between the output terminals 111, 112. It is to be understood that the coupling of the circuits 100, 100' provides a voltage divider arrangement such that a potential at position Vx is determined by the ratio of Zf to Zn.

Figure 6:
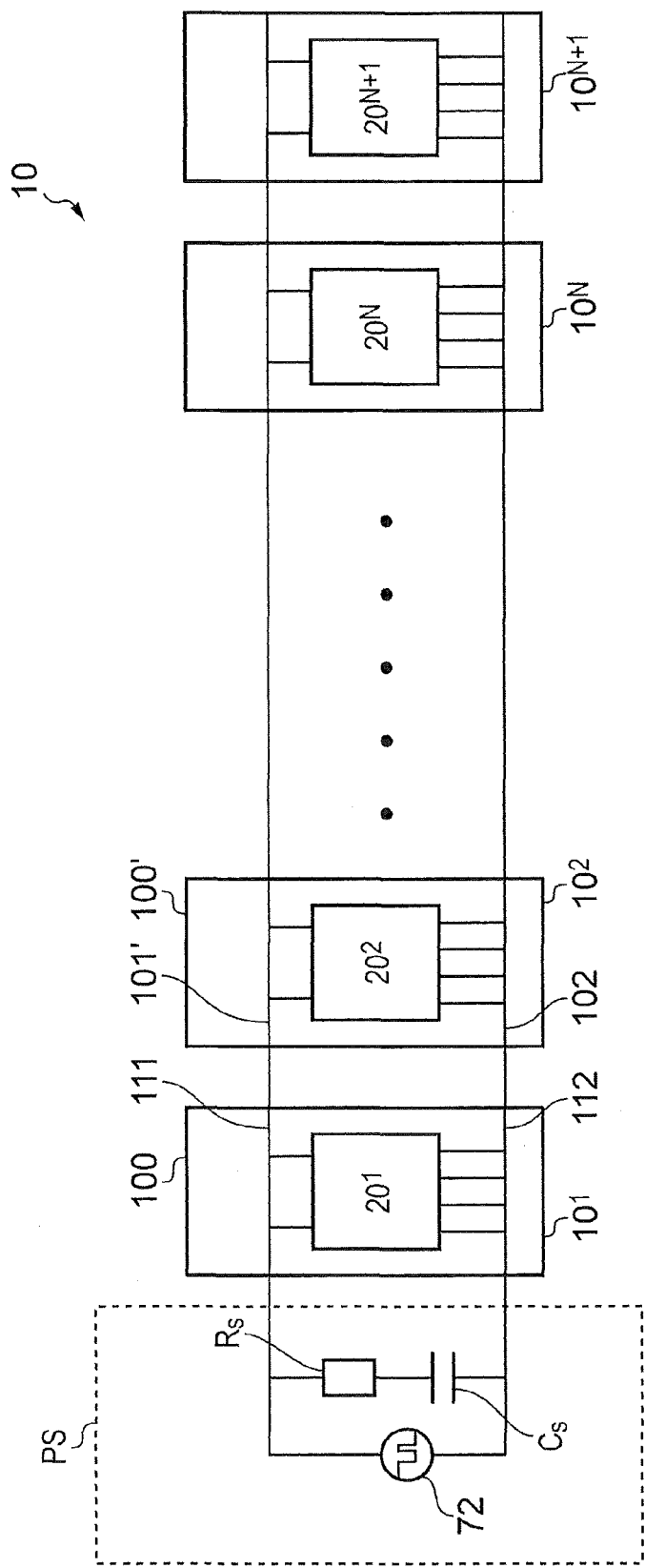
FIG. 6 shows a series of N+1 circuits according to embodiments of the present invention connected together in a network.

FIG. 6 is a schematic illustration of a network 10 comprising a power supply PS coupled to a chain of circuits 100, 100' according to the present invention.

It is to be understood that if a short circuit occurs in a cable between any two circuits 100, 100' such that output lines 111, 112 of one circuit 100 become directly connected to one another and input lines 101', 102' of the other circuit 100' become directly connected, the one circuit 100 assumes automatically a terminating condition in which its terminating portion C1 is connected between respective input lines 101, 102 of the circuit 100 and the output control portion C3 limits the amount of current permitted to flow therethrough to the first value. This allows any network devices between that circuit 100 and the power supply to continue functioning despite the existence of a short circuit between two circuits 100, 100' of the network.

Other arrangements are also useful.

Throughout the description and claims of this specification, the words "comprise" and "contain" and variations of the words, for example "comprising" and "comprises", means "including but not limited to", and is not intended to (and does not) exclude other moieties, additives, components, integers or steps.

Throughout the description and claims of this specification, the singular encompasses the plural unless the context otherwise requires. In particular, where the indefinite article is used, the specification is to be understood as contemplating plurality as well as singularity, unless the context requires otherwise.

Features, integers, characteristics, compounds, chemical moieties or groups described in conjunction with a particular aspect, embodiment or example of the invention are to be understood to be applicable to any other aspect, embodiment or example described herein unless incompatible therewith.

The invention claimed is:

1. An electronic circuit arranged to terminate automatically a plurality of conductors at or near a node of a network comprising:
a first input terminal electrically coupled to a first output terminal;
a second input terminal electrically coupled to a second output terminal;
selectable current limiting means (SCLM) arranged to limit an amount of current that may flow between the second output terminal and the second input terminal; and
detecting means arranged to control switching means operable to switch the circuit between a first and a second condition responsive to the electrical potential Vx of the second output terminal,
wherein in the first condition the circuit is a terminating circuit and the SCLM is selected to have a first current limit, and
in the second condition the circuit is a continuing circuit and the SCLM is selected to have a second current limit.

2. A circuit according to claim 1 arranged to assume the first condition when an open circuit condition exists between the first and second output terminals.

3. A circuit according to claim 1 arranged to assume the first condition when a short circuit condition exists between the first and second output terminals.

4. A circuit according to claim 1 wherein the second current limit is greater than the first current limit.

5. A circuit according to claim 1 wherein the second current limit is less than the first current limit.

6. A circuit according to claim 1 wherein the second current limit corresponds to a maximum current allowed to be drawn by the circuit when the circuit is a continuing circuit.

7. A circuit according to claim 1 wherein the first current limit corresponds to a maximum current allowed to be drawn by the circuit when the circuit is a terminating circuit and a short circuit condition exists between the first and second output terminals.

8. A circuit according to claim 1 wherein the detecting means comprises comparator means arranged to compare the value of the electrical potential Vx at the second output terminal with one or more reference potentials and to provide an output responsive to a difference between Vx and the one or more reference potentials thereby to control the circuit to switch between the first and second conditions.

9. A circuit according to claim 1 wherein the SCLM comprises a controlled constant current source.

10. A node of a communications network comprising an electronic circuit according to claim 1.

11. A communications network comprising a circuit according to claim 1.

12. A circuit according to claim 1 arranged to assume the second condition when a load between the first and second output terminals has an impedance ZL between first and second impedance values Z1 and Z2 respectively, where 0<Z1 <ZL <Z2 and Z2 is finite.

13. A circuit according to claim 12 wherein the first impedance value Z1 is greater than around 1 kilohm and the second impedance value Z2 is less than around 50 kilohms.

14. A circuit according to claim 1 wherein the detecting means comprises first and second comparators, the first comparator being arranged to compare the value of electrical potential Vx at the second output terminal with a first reference potential Vref1 and to produce an output responsive to the value of Vx and Vref1, the second comparator being arranged to compare the value of electrical potential Vx at the second output terminal with a second reference potential Vref2 and to produce an output responsive to the value of Vx and Vref2, the detecting means being operable to control the circuit by means of switching means to switch between the first and second conditions in dependence on the output of the first and second comparators.

15. A circuit according to claim 14 wherein Vref1 is greater than Vref2.

16. A circuit according to claim 14 wherein the outputs of the first and second comparators are combined by means of a logical AND operation thereby to provide an output of the detecting means.

17. A circuit according to claim 16 wherein the output of the detecting means is coupled to the switching means by means of a switching means control portion, the switching means control portion comprising a shunt portion coupled between the first and second input terminals.

18. A circuit according to claim 17 wherein the shunt portion comprises a resistor in series with one or more switches, the switches being arranged to assume a closed condition thereby to couple the resistor between the first and second input terminals when the circuit is in the second condition.

19. A circuit according to claim 1 wherein in the first condition a terminating portion of the circuit is coupled between the first and second input terminals and in the second condition the terminating portion is not coupled between the first and second input terminals.

20. A circuit according to claim 19 wherein the terminating portion comprises impedance matching means.

21. A circuit according to claim 20 wherein the impedance matching means comprises a terminating resistor connected in series with a terminating capacitor.

22. A circuit according to claim 19 wherein the switching means comprises one or more switching elements in series with the terminating portion.

23. A circuit according to claim 22 wherein one of the switching elements is provided between the terminating portion and the first input terminal and another of the switching elements is provided between the terminating portion and the second input terminal.

24. A circuit according to claim 22 wherein the one or more switching elements each comprise a transistor device.

* * * * *